US011316482B2

(12) United States Patent
Panseri et al.

(10) Patent No.: US 11,316,482 B2
(45) Date of Patent: Apr. 26, 2022

(54) RADIO FREQUENCY POWER AMPLIFIER ADAPTIVE DIGITAL PRE-DISTORTION

(71) Applicant: Silicon Laboratories Inc., Austin, TX (US)

(72) Inventors: Luigi Panseri, Austin, TX (US); Mustafa Koroglu, Austin, TX (US); Emmanuel Gautier, Betton (FR); Pascal Blouin, Domloup (FR)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/904,811

(22) Filed: Jun. 18, 2020

(65) Prior Publication Data

US 2021/0399690 A1 Dec. 23, 2021

(51) Int. Cl.
*H03F 1/32* (2006.01)
*H03F 3/24* (2006.01)
*H04B 1/04* (2006.01)

(52) U.S. Cl.
CPC .......... *H03F 1/3241* (2013.01); *H03F 3/245* (2013.01); *H04B 1/0475* (2013.01); *H03F 2200/294* (2013.01); *H03F 2200/451* (2013.01); *H03F 2201/3215* (2013.01); *H04B 2001/0425* (2013.01)

(58) Field of Classification Search
CPC .. H03F 1/3247; H03F 3/24; H03F 2201/3233; H03F 2200/451; H03F 1/3241; H03F 3/245; H03F 2200/294; H03F 2201/3215; H04B 1/0475; H04B 2001/0425; H04L 27/368
See application file for complete search history.

(56) References Cited

U.S. PATENT DOCUMENTS

| | | | |
|---|---|---|---|
| 9,813,190 B1* | 11/2017 | Sutskover | H04L 1/0042 |
| 2003/0058959 A1* | 3/2003 | Rafie | H04L 27/368 |
| | | | 375/296 |
| 2005/0001677 A1* | 1/2005 | Saed | H03F 1/0294 |
| | | | 330/149 |
| 2007/0273439 A1* | 11/2007 | Lin | H03F 1/3247 |
| | | | 330/136 |

(Continued)

OTHER PUBLICATIONS

Sai-Wang Tam, el. "A dual band (2G/5G) IEE 802.11b/g/n/ac 80Mhz bandwidth AM-Am envelope feedback power amplifier with digital pre-distortion", 2015 IEEE Radio Frequency Integrated Circuits Symposium (RFIC), 15634765 (Year: 2015).*

(Continued)

*Primary Examiner* — Sung S Ahn
(74) *Attorney, Agent, or Firm* — Trop, Pruner & Hu, P.C.

(57) ABSTRACT

In an embodiment, an apparatus includes: a modulator to modulate a first signal; a distortion circuit coupled to the modulator to digitally pre-distort the first signal to compensate for a distortion of an amplifier; a distortion characterization circuit coupled to the distortion circuit to determine the distortion of the amplifier and configure the distortion circuit based on the determined distortion; a mixer coupled to the distortion circuit to upconvert the pre-distorted first signal to a pre-distorted radio frequency (RF) signal; and the amplifier coupled to the mixer to amplify the pre-distorted RF signal and output an amplified RF signal.

15 Claims, 9 Drawing Sheets

(56) References Cited

U.S. PATENT DOCUMENTS

| 2012/0219048 A1* | 8/2012 | Camuffo | H03F 3/72 375/224 |
|---|---|---|---|
| 2013/0329833 A1* | 12/2013 | Bai | H03F 1/3247 375/297 |
| 2013/0335140 A1* | 12/2013 | Kawasaki | H03F 1/42 330/10 |
| 2014/0036973 A1* | 2/2014 | Au | H03F 1/3241 375/221 |

OTHER PUBLICATIONS

W.H. Doherty, "A New High Efficiency Power Amplifier For Modulated Waves," May 1936, 25 pages total.

Ercan Kaymaksut, et al., "CMOS Transformer-Based Uneven Doherty Power Amplifier for WLAN Applications," 2011, 4 pages total.

Song Hu, et al. "28/37/39GHz Multiband Linear Doherty Power Amplifier in Silicon for 5G Applications," 2019, 12 pages total.

Ercan Kaymaksut, et al., "Transformer-Based Uneven Doherty Power Amplifier in 90 nm CMOS for WLAN Applications," IEEE Journal of Solid-State Circuits, vol. 47, No. 7, Jul. 2012, 13 pages total.

* cited by examiner

RADIO FREQUENCY POWER AMPLIFIER ADAPTIVE DIGITAL PRE-DISTORTION

BACKGROUND

A radio frequency (RF) power amplifier (RFPA) is typically designed to meet certain performance requirements (linearity and efficiency) while driving a load (antenna) whose impedance is known (typically 50 ohms). In most applications, the antenna design does not match the assumption for several reasons (antenna area constraints, metal objects near the antenna, etc.) and so the impedance the RFPA has to drive is not well known.

Under these conditions of load mismatch, the RFPA characteristic is heavily impaired and typically the solution to improve linearity is to reduce delivered power (called a power backoff) to the point where the RFPA is linear, and therefore operates with reduced distortion. However, this typically fixed power back off is based on worst case scenarios. As such, the RFPA operates at a lower power level and as a result loses efficiency.

SUMMARY OF THE INVENTION

According to one aspect, an apparatus includes: a modulator to modulate a first signal; a distortion circuit coupled to the modulator to digitally pre-distort the first signal to compensate for a distortion of an amplifier; a distortion characterization circuit coupled to the distortion circuit to determine the distortion of the amplifier and configure the distortion circuit based on the determined distortion; a mixer coupled to the distortion circuit to upconvert the pre-distorted first signal to a pre-distorted radio frequency (RF) signal; and the amplifier coupled to the mixer to amplify the pre-distorted RF signal and output an amplified RF signal.

In one embodiment, the distortion characterization circuit comprises a closed loop feedback circuit coupled to the amplifier. The distortion characterization circuit may provide a plurality of pre-distortion values to the distortion circuit, each of the plurality of pre-distortion values associated with an amplitude bin. The distortion circuit is to select at least one of the plurality of pre-distortion values based on an amplitude of the first signal and digitally pre-distort the first signal using the at least one of the plurality of pre-distortion values.

In an embodiment, the distortion circuit comprises at least one table including a plurality of entries, each entry to store pre-distortion information based on the determined distortion. The distortion circuit may digitally pre-distort the first signal according to a pre-distortion transfer function. The apparatus may further comprise a loopback circuit coupled between the amplifier and the distortion characterization circuit to provide the amplified RF signal output by the amplifier to the distortion characterization circuit. The loopback circuit may comprise an attenuator and a transconductance amplifier coupled to the attenuator.

The distortion circuit may comprise: a first lookup table to digitally pre-distort the first signal according to an amplitude transfer function of the amplifier; and a second lookup table to digitally pre-distort the first signal according to a phase transfer function of the amplifier. The distortion characterization circuit may determine the distortion of the amplifier for a first packet and the distortion circuit is digitally pre-distort a next packet based on the determined distortion of the amplifier for the first packet. The distortion characterization circuit may: receive a first plurality of samples of a first packet before the first packet is provided to the amplifier and receive a second plurality of samples of the first packet after amplification in the amplifier; and determine, for a plurality of bins, a gain of the amplifier based on the first plurality of samples and the second plurality of samples, and generate a set of pre-distortion values for the plurality of bins based on the gain of the amplifier. The distortion characterization circuit may re-configure the distortion circuit in response to one or more of temperature variation and voltage variation that exceeds a threshold.

In another aspect, a method comprises: receiving, in a distortion characterization circuit of a transceiver, a first packet output from an amplifier of the transceiver; determining, in the distortion characterization circuit, a gain distortion of the amplifier based on the first packet; configuring an adaptive distortion circuit of the transceiver based on the gain distortion; pre-distorting, in the adaptive distortion circuit, a second packet; and transmitting the pre-distorted second packet via the amplifier of the transceiver.

In an embodiment, the method further comprises receiving, in the distortion characterization circuit, the first packet from a transmitter path of the transceiver. The method further comprises processing the first packet from the transmitter path and processing the first packet output from the amplifier to determine the gain distortion, comprising determining, for each of a plurality of bins, a first pre-distortion value for a magnitude of the gain distortion and a second pre-distortion value for a phase of the gain distortion. The method may further comprise: providing, for each of the plurality of bins, the first pre-distortion value and the second pre-distortion value to the adaptive distortion circuit; and pre-distorting the second packet using one or more of the first pre-distortion value and the second pre-distortion value for one or more of the plurality of bins. The method may further comprise dynamically re-configuring the adaptive distortion circuit in response to expiration of a trigger interval.

According to another aspect, an apparatus comprises a transmitter to transmit a RF signal. The transmitter may comprise: a modulator to modulate a first baseband signal; an adaptive distortion circuit coupled to the modulator to digitally pre-distort the modulated first baseband signal, where the adaptive distortion circuit is to be dynamically updated based on a measured distortion of an amplifier; a mixer coupled to the adaptive distortion circuit to upconvert the pre-distorted modulated first baseband signal to the RF signal; and the amplifier coupled to the mixer to amplify and output the RF signal. The apparatus may further include a loopback circuit coupled to the amplifier to provide the RF signal to a receiver. The apparatus may further include the receiver coupled to the loopback circuit. In turn, the receiver may comprise: a second mixer to receive and downconvert the RF signal to a second baseband signal; and a distortion characterization circuit coupled to the second mixer to receive the first baseband signal and the second baseband signal and based thereon to measure the distortion of the amplifier, where the distortion characterization circuit is to dynamically update the adaptive distortion circuit based on the measured distortion.

In an embodiment, the adaptive distortion circuit comprises at least one table including a plurality of entries, each entry to store pre-distortion information based on the measured distortion, where the distortion characterization circuit is to provide the pre-distortion information to the adaptive distortion circuit. The distortion characterization circuit may dynamically update the pre-distortion information to dynamically update the adaptive distortion circuit. The distortion characterization circuit may be disabled while the transmitter communicates a plurality of packets.

DETAILED DESCRIPTION

In various embodiments, a wireless device including or coupled to a power amplifier may be configured to adaptively pre-distort signals provided to the power amplifier to cancel distortion of the power amplifier. More particularly in embodiments herein, a closed loop circuit is provided to measure power amplifier distortion and use such information for purposes of canceling distortion in future communications. In particular embodiments, a distortion characterization circuit may measure amplifier distortion of a first packet that is transmitted and use this information to configure an adaptive distortion circuit to pre-distort additional packets.

With embodiments, a power amplifier may realize higher output power with good efficiency. To this end, both amplitude distortion (AM-AM) and phase distortion (AM-PM) may be corrected. In addition, a power back off may be provided to ensure that the power amplifier does not reach saturation levels. With embodiments this power back off may be set at lower levels as a result of the distortion reduction techniques described herein. Note that the adaptive techniques described herein may be performed for each band channel or group of band channels, as a load impedance coupled to a power amplifier may vary significantly over these different bands. With embodiments, the distortion calibration performed may be executed at a given trigger interval to track and correct slow variations, e.g., due to supply and temperature changes. Embodiments also enable reduced silicon validation time, which would otherwise be required without pre-distortion described herein, in determining a minimum back off for all modulation types across all operating conditions.

By pre-distorting input signals to a RFPA as described herein, overall input-output characteristics of the RFPA may be linearized. By improving RFPA linearity, it is possible to deliver higher power and improve efficiency. Embodiments enable compensation of RFPA performance across load mismatch, temperature, supply voltage, process variations and device aging, so that the delivered power is always maximized for any operating conditions.

Figure 1:
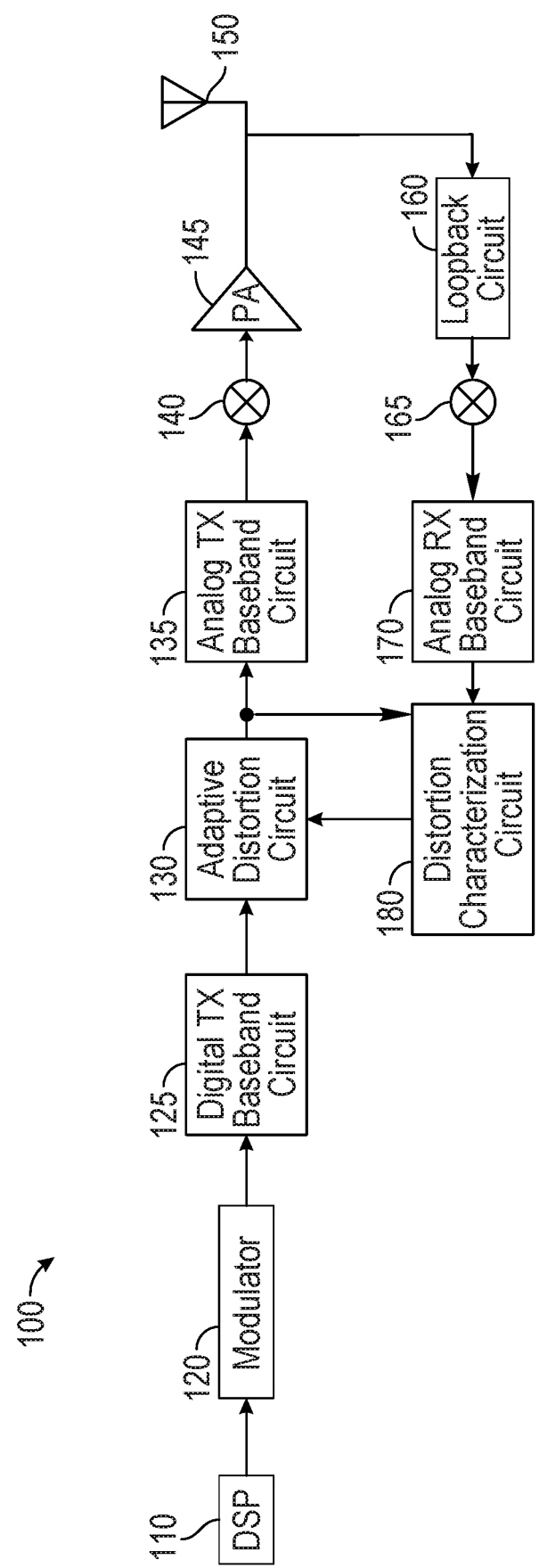
FIG. 1 is a block diagram of a device in accordance with an embodiment.

Referring now to FIG. 1, shown is a block diagram of a device in accordance with an embodiment. As shown in FIG. 1, device 100 may be any type of device including radio functionality. As one example, device 100 may be an integrated circuit (IC) that includes radio functionality, such as a transceiver to communicate according to one or more wireless communication protocols, such as a Wi-Fi protocol in accordance with an IEEE 802.11 standard. Of course, device 100 may be part of a larger system including radio functionality such as a given computing and/or communication device, among other examples.

More specifically, device 100 may be an IC including all the circuitry shown (with the exception of an antenna 150). In FIG. 1, circuitry relevant to performing adaptive pre-distortion is shown. Understand that additional circuitry, including a full receiver chain may be present.

As illustrated, device 100 includes a digital signal processor (DSP) 110 that may include various control capabilities. In addition, DSP 110 may include or is coupled to circuitry that generates messages for communication. As such, DSP 110 outputs such messages to a modulator 120. In an embodiment, modulator 120 may modulate these messages according to a given modulation scheme, e.g., orthogonal frequency division multiplexing (OFDM) modulation. In turn, modulated signals are provided to a digital transmit baseband circuit 125 which may perform various processing on the modulated signals, such as oversampling, filtering, gain control (aka power back off), calibration for image rejection and LO leakage. In an embodiment, digital transmit baseband circuit 125 may store or otherwise access power back off values, e.g., based on a given modulation type and rate. Understand that with pre-distortion of signals as described herein, these power back off values may be set at lower levels, thus improving power and efficiency.

Still with reference to FIG. 1, these modulated signals are provided to an adaptive distortion circuit 130. In embodiments herein, adaptive distortion circuit 130 may be configured to pre-distort these modulated signals according to an expected distortion that is incurred in a transmit path. As such non-linearities of various components including (but not limited to) an analog transmit baseband circuit 135, a mixer 140, and an amplifier 145 may be corrected. As will be described herein, adaptive distortion circuit 130 may include circuitry that can be dynamically configured and re-configured to provide this pre-distortion based on actual distortion measured for one or more packet communications from amplifier 145. In embodiments, adaptive distortion circuit 130 may be configured to pre-distort the incoming signals for both magnitude and phase distortions.

After pre-distorting the signals, the pre-distorted signals are provided to analog transmit baseband circuit 135. Baseband circuit 135 may further process these pre-distorted signals, including filtering, gain control and so forth. In turn, processed signals are provided to mixer 140 which may convert signals, e.g., from a baseband frequency (or intermediate frequency or other such frequency) to a radio frequency (RF). In turn, the RF signals are provided to amplifier 145. Amplifier 145 may be implemented as a given type of power amplifier, and may amplify the signals and output the amplified RF signals to an antenna 150 for communication to one or more devices, e.g., in a wireless local area network with device 100.

As further illustrated in FIG. 1, these amplified RF signals may further be processed within device 100 for purposes of determining a distortion level of amplifier 145. To this end, an output of amplifier 145 is coupled to a loopback circuit 160 which may in turn provide the amplified RF signals to a mixer 165, which may downconvert the RF signals, e.g., to baseband (or another lower frequency). In turn, these downconverted signals are provided to an analog receiver baseband circuit 170 which may perform various processing, such as filtering, decimation or so forth. In turn, resulting signals are provided to a distortion characterization circuit 180.

In various embodiments, distortion characterization circuit 180 may be configured to determine a level of distortion in these received signals. To this end, as shown distortion characterization circuit 180 further may receive pre-distorted signals from adaptive distortion circuit 130. Distortion characterization circuit 180 may be configured to determine a level of distortion present in the transmit chain based on various processing of the pre-distorted signals and the representation of the signals output by amplifier 145. While different implementations are possible, in one embodiment distortion characterization circuit 180 may determine separate pre-distortion values for both magnitude and phase and provide these pre-distortion values to adaptive distortion circuit 130 for performing the pre-distortion described herein. Understand while shown at this high level in the embodiment of FIG. 1, many variations and alternatives are possible.

Figure 2:
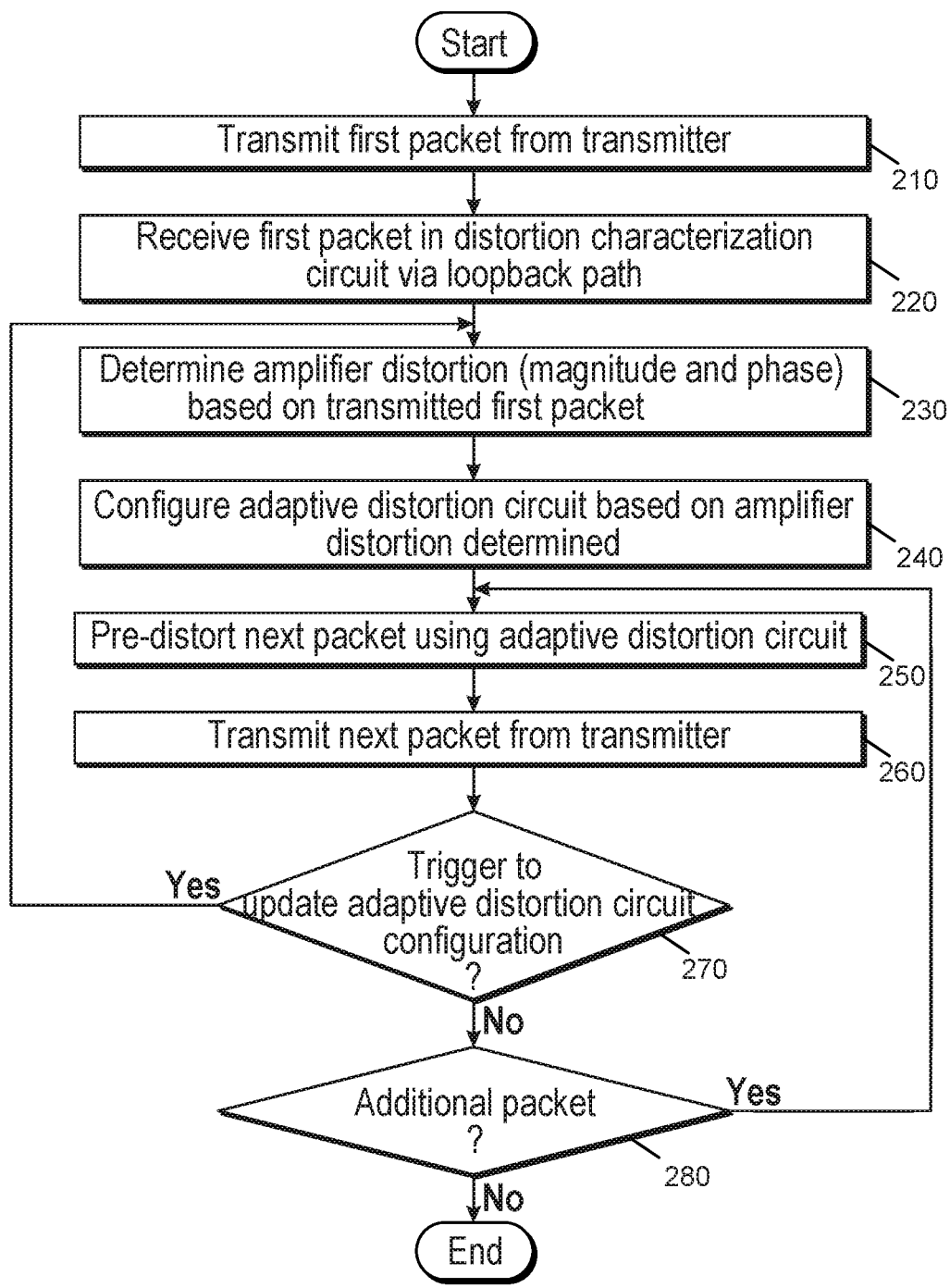
FIG. 2 is a flow diagram of a method in accordance with an embodiment.

Referring now to FIG. 2, shown is a flow diagram of a method in accordance with an embodiment. As shown in FIG. 2, method 200 is a high level view of operations performed in pre-distorting signals to be transmitted via a power amplifier having a given level of distortion. In embodiments, method 200 may be performed by hardware circuitry, firmware, software and/or combinations thereof. In a particular embodiment, operations described in FIG. 2 may be performed by one or more circuits internal to an integrated circuit, such as a distortion characterization circuit, a distortion circuit, and additional hardware circuitry of the IC. As an example, this circuit may execute instructions stored in a non-transitory storage medium to effect at least some of the operations described.

As illustrated, method 200 begins by transmitting a first packet from a transmitter (block 210). Understand that this first packet may be in accordance with a given wireless communication protocol, e.g., an IEEE 802.11 protocol. To effect this packet transmission, various circuitry of a transmitter path may process the packet for transmission. With relevance here, note that this processing includes amplifying the first packet within a power amplifier, where the power amplifier is coupled to an antenna that radiates this RF signal. The PA may have a certain amount of distortion such that this first packet has some level of distortion.

To effect adaptive digital pre-distortion as described herein, in addition to passing this amplified RF signal to the antenna, the PA also may be coupled to a loopback path which provides the amplified first packet to a distortion characterization circuit (block 220). In this distortion characterization circuit, distortion of (at least) the amplifier may be determined (block 230). More specifically in an embodiment, both magnitude and phase distortion of the amplifier may be determined based on this transmitted first packet.

While details of this distortion determination are described further below, at a high level understand that characterization of the distortion may include determination of pre-distortion values (e.g., for both magnitude and phase) at a number of different input signal levels (e.g., different amplitudes ranging from a minimum amplitude to a maximum amplitude).

Still with reference to FIG. 2, control next passes to block 240. At block 240 the adaptive distortion circuit may be configured based on the determined amplifier distortion. Although many different types of configuration operations are possible, in a particular embodiment pre-distortion values (both for magnitude and phase) may be provided to corresponding lookup tables of the adaptive distortion circuit. Next control passes to block 250 where a next packet (such as a second packet immediately following the first packet) may be pre-distorted using the adaptive distortion circuit. Details for performing this pre-distortion are described further below.

At block 260 this next packet may be transmitted from the transmitter. As such, this next packet, now pre-distorted, is amplified in the power amplifier and is output via the antenna. Note that by way of the pre-distortion, significant compensation for distortion of the power amplifier may be realized, resulting in a transmitted signal that has greater fidelity.

Still with reference to FIG. 2, next it may be determined whether a trigger to cause an update to the adaptive distortion circuit configuration has been identified (block 270). Although embodiments are not limited in this regard, this trigger may be based on a change in one or more environmental conditions, such as temperature, supply voltage, impedance variation or so forth. As another example, the trigger may be based on an amount of time since a last update to the adaptive distortion circuit configuration.

If such trigger is identified, control passes back to block 230 where the amplifier distortion may again be determined. Otherwise if no trigger is identified, control passes to diamond 280 to determine whether there is an additional packet to transmit. If so, control passes back to block 250 for pre-distortion of the next packet to be transmitted. Otherwise if no further packets are to be transmitted, method 200 may conclude. Understand while shown at this high level in the embodiment of FIG. 2, many variations and alternatives are possible.

While embodiments are not limited in this regard, in some implementations, adaptive pre-distortion may be performed using information stored in one or more lookup tables (LUTs). Such LUTs may provide maximum flexibility and minimize intensive digital computation that increases die area and power dissipation, compared to polynomial-based digital pre-distortion. The LUT generation may be based on the actual transmit signal, so there is no need for dedicated test signals which are not allowed in certain applications. As described herein, embodiments may average a captured signal, which may improve signal-to-noise ratio of uncorrelated noise sources (such as device and supply noise, adjacent transmitters, transmitter and receiver finite image rejection). A closed feedback loop that provides the captured signals may operate with very low loop bandwidth, so that loop stability is not a concern. The design of high efficiency RFPAs is intrinsically more sensitive to the environment that the RFPA operates at, making the need for adaptive digital pre-distortion even more necessary.

Embodiments thus linearize a transmitter by means of pre-distorting the RFPA input signal. By adaptively changing the pre-distortion transfer function based on RFPA load, temperature, supply voltage and device aging, it is possible to maximize power delivered to an antenna. In a particular implementation, two LUTs may be provided (one for AM-AM and one for AM-PM), where these LUTs are generated based on the measured RFPA output voltage while transmitting.

Note that one or more of the LUTs may be tweaked by adjusting slope and offset, to correct for systematic impairments (e.g., receiver distortion) and to optimize the RFPA performance in terms of Error Vector Magnitude (EVM) and Spectral Emission Mask (SEM). For the next transmission packet, the input signal is pre-distorted with the LUTs built based on the previously transmitted packet to linearize the overall transmitter characteristic. Depending on the limiting performance parameter (EVM or SEM), it is thus possible to modify the LUTs so that the output power can be increased or more margin from the limits can be achieved.

Figure 3:
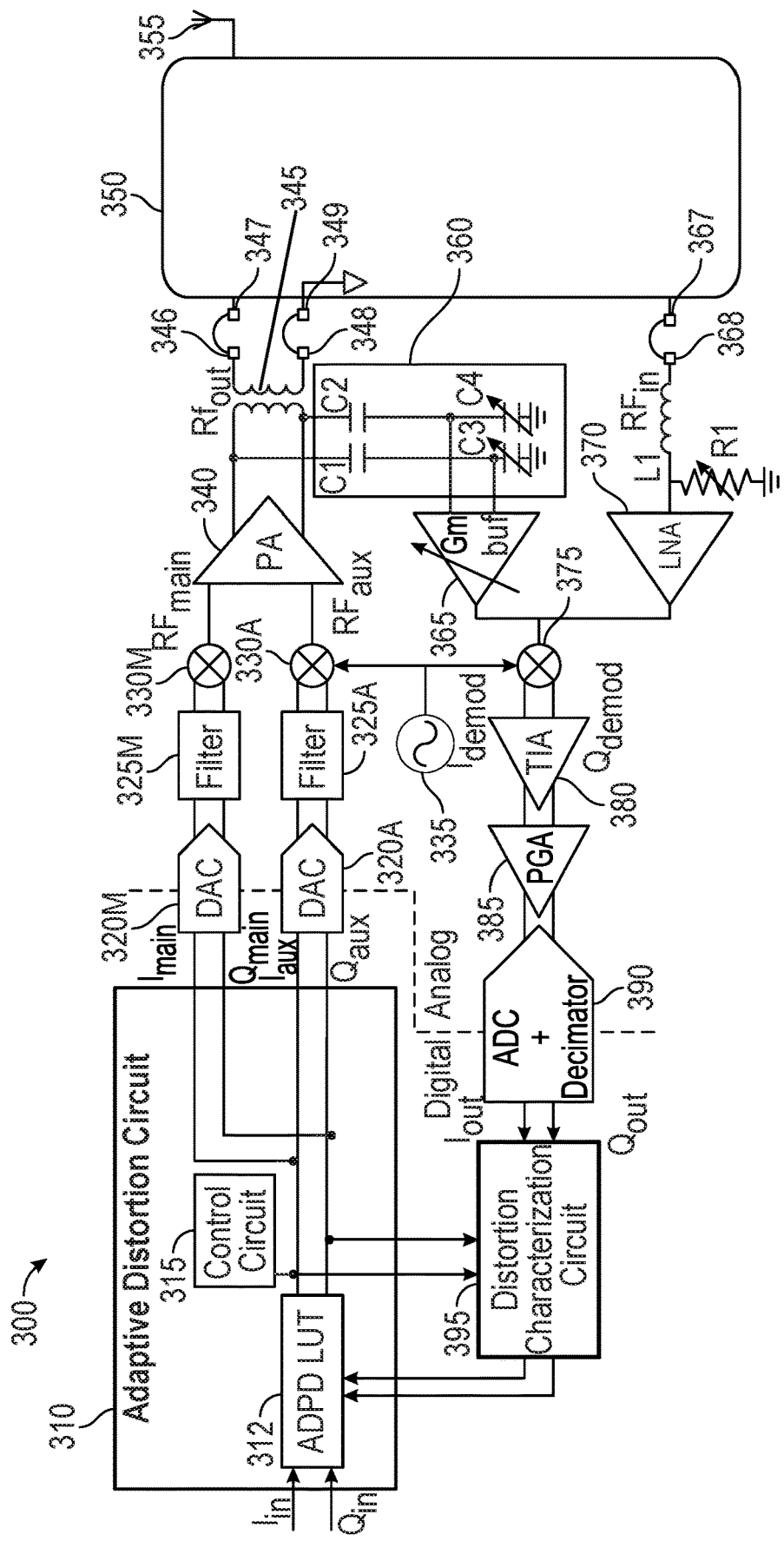
FIG. 3 is a block diagram of a wireless transceiver in accordance with an embodiment.

Referring now to FIG. 3, shown is a block diagram of a wireless transceiver in accordance with an embodiment. As shown in FIG. 3, transceiver 300 includes transmit and receive paths. With regard to the transmitter path, incoming modulated baseband signals, which may be complex signals, are received in an adaptive distortion circuit 310. In embodiments herein adaptive distortion circuit 310 may pre-distort the incoming signals based on a determined amount of distortion in a power amplifier 340. In the high level shown in FIG. 3, adaptive distortion circuit 310 includes a control circuit 315, which may control pre-distortion operations, details of which are described further herein. As further illustrated, adaptive distortion circuit 310 also includes a first lookup table 312.

After pre-distortion of the signals, pre-distorted signals are provided to main and auxiliary paths which include digital-to-analog converters (DACs) 320M,A and filters 325M,A. Although shown with these limited components, understand that additional baseband processing may be performed in certain embodiments.

Next, the pre-distorted baseband signals may be upconverted via corresponding mixers 330M,A, into RF signals that are provided to PA 340. To effect the upconversion to a desired RF level, a frequency synthesizer 335 provides a mixing signal to mixers 330. Although different implementations are possible, PA 340 may be implemented as a Doherty power amplifier in the embodiment of FIG. 3. Further note that the separation of the transmit path into main and auxiliary paths may be for purpose of this Doherty power amplifier implementation. In other embodiments, understand that a transmit path may have a single main path and no auxiliary path. Also understand that in other embodiments, PA 340 may be another amplifier type such as a Class A amplifier, Class AB, B, C, Polar PA, Envelope Tracking PA or so forth.

The output of PA 340, which may be a differential signal, is coupled to off-chip components via a transformer 345 and corresponding IC pads 346, 348 that in turn couple to off-chip pads 347, 349 that in turn couple to a matching network 350 that in turn provides a single-ended RF signal to antenna 355.

To enable distortion of PA 340 to be determined, the amplified RF signal output by PA 340 is coupled via a loopback path, to be received in a destination, namely a distortion characterization circuit 395. As illustrated in FIG. 3, this loopback path includes an attenuator 360 which may be implemented as a capacitive attenuator including a plurality of capacitors C1, C2 and programmable capacitors C3 C4 that couple the differential amplified RF signal to a transconductance buffer 365, which itself may be programmable. As illustrated, buffer 365 outputs a single-ended RF signal, provided to a mixer 375. Of course in other cases, there is no conversion to single-ended here, and a differential RF signal can be passed.

In any case, mixer 375 downconverts the signal, e.g., to a baseband complex signal that passes through portions of a receiver chain including a transimpedance amplifier 380, a programmable gain amplifier 385 and, after digitization and decimation within an analog-to-digital converter (ADC) and decimator 390, to distortion characterization circuit 395. Additional portions of the receiver path are shown, including an inductor L1 and an RF attenuator R1, which provides an RF input signal, received from antenna 355 via pads 367, 368 to a low noise amplifier (LNA) 370. In an embodiment LNA 370 may be implemented as a transconductance amplifier. Understand that additional circuitry, such as antenna switches and so forth are not shown for ease of illustration.

As further shown, distortion characterization circuit 395 also receives pre-distorted signals from adaptive distortion circuit 310 to enable the determination of the level of distortion in PA 340 and additional components coupled between adaptive distortion circuit 310 and PA 340. Understand while shown at this high level in the embodiment of FIG. 3, many variations and alternatives are possible.

Figure 4A:
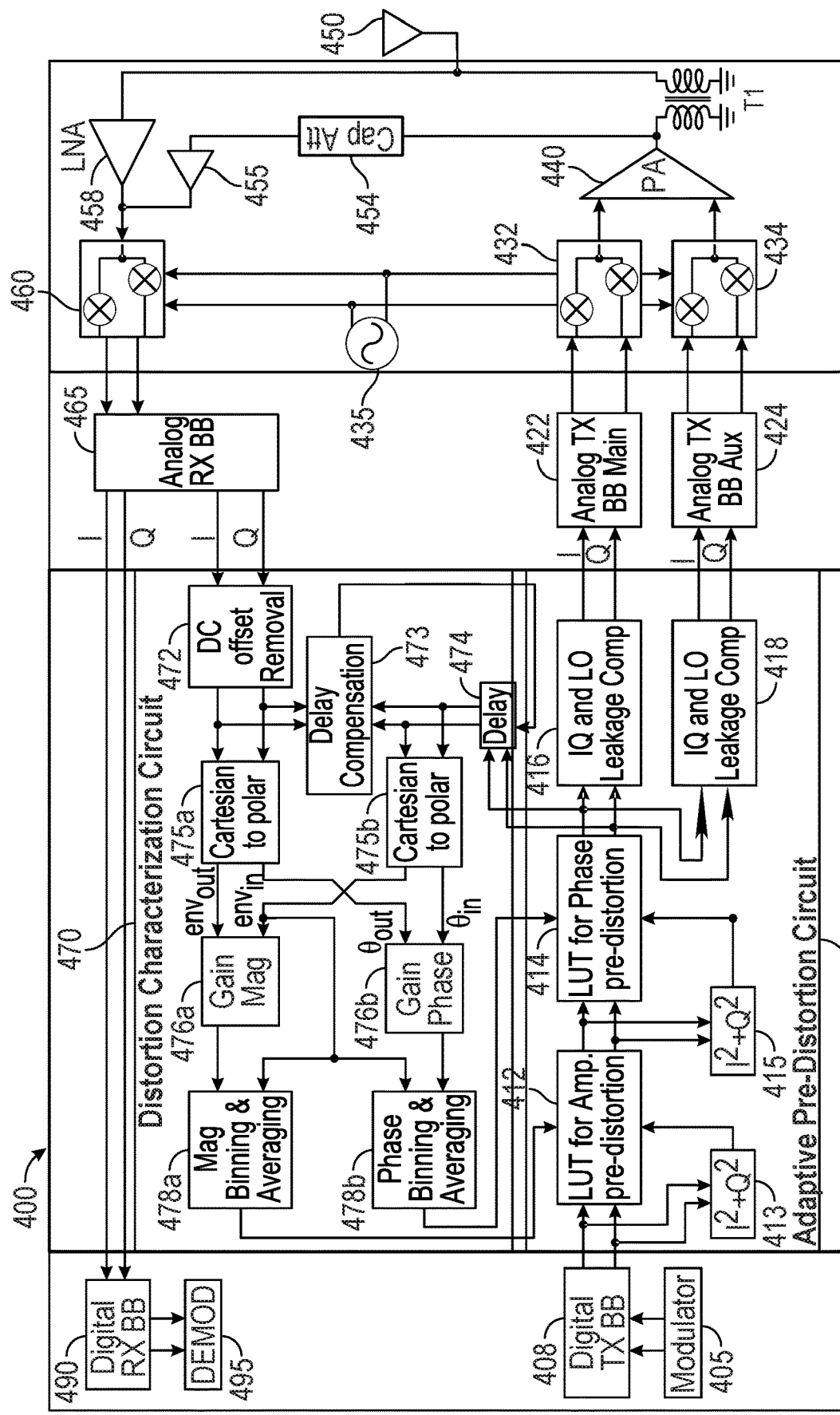
FIG. 4A is a block diagram of a wireless transceiver in accordance with another embodiment.

Referring now to FIG. 4A, shown is a block diagram of a wireless transceiver in accordance with another embodiment. More specifically, wireless transceiver 400 shows further details of a distortion characterization circuit and an adaptive distortion circuit according to an embodiment.

As illustrated in FIG. 4A in the transmit direction, transceiver 400 includes a modulator 405 which may modulate incoming signals, e.g., according to an OFDM modulation scheme, to output, e.g., 11-bit modulated samples that are provided to a digital transmit baseband circuit 408, which may perform various processing on signals before they are provided to adaptive distortion circuit 410. As seen, the incoming signals are provided to a calculator 413, which determines a sum of squares magnitude value of the complex signal. This value may be used to access a first lookup table 412, which may be implemented as an amplitude pre-distortion LUT that includes multiple entries. More specifically, based upon a determined magnitude of a given sample, a corresponding entry in LUT 412 is accessed and a magnitude pre-distortion value is obtained. Understand that LUT 412 may further include processing circuitry to pre-distort a given sample with this pre-distortion value which, as shown, is output to another calculator 415 and a second pre-distortion lookup table 414, namely a phase LUT which may be implemented as a phase pre-distortion LUT that includes multiple entries. Operation of LUT 414 may be the same as LUT 412, such that based on a determined magnitude determined in calculator 415, a given entry is accessed within LUT 414 and a phase pre-distortion value is applied to the corresponding sample. Also understand that in other implementations a single lookup table may be provided. Of course the single lookup table itself may be formed of multiple lookup tables including a first lookup table for magnitude pre-distortion and a second lookup table for phase pre-distortion. While not shown for ease of illustration, understand that LUT's 412, 414 may further include hardware circuitry, such as multipliers and so forth to perform the pre-distortion of a received signal with a corresponding pre-distortion value.

Now the resulting magnitude and phase pre-distorted signal is output to further processing circuitry, including leakage compensation circuits 416, 418, which may provide IQ and local oscillator leakage compensation. The resulting signals pass through analog transmit baseband circuitry 422, 424. Then after upconversion to RF via corresponding mixers 432, 434, the resulting pre-distorted RF signals are provided to a PA 440, which may be implemented as a Doherty power amplifier in one embodiment. The resulting amplified signal is output via a transformer T1 to an antenna 450.

As further shown, a loopback path is used to couple the amplified RF signal back to a distortion characterization circuit 470. As shown, this loopback path includes a capacitive attenuator 454. However, the attenuator can be implemented in many different ways (resistive, inductive, etc.) in other implementations. The loopback path further includes a loopback transconductor 455 that in turn provides a single ended-RF signal to a downconversion mixer 460. Note that mixing signals are provided to mixers 432, 434 and 460 via a frequency synthesizer 435.

As further shown in FIG. 4A, a receiver path to receive incoming RF signals received via antenna 450 includes a LNA 458 that in turn couples to mixer 460. The resulting downconverted signals (e.g., to baseband) are provided to analog receiver baseband circuit 465 for various processing. In turn, received signals are provided to a digital receiver baseband circuit 490 and a demodulator 495, which may demodulate the signals and provide them to a given destination circuit.

In general, transceiver 400 may perform various processing on the output voltage of PA 440 to obtain information for use in distortion characterization. These operations may include, in an implementation, attenuation, downconversion (e.g., to baseband complex In-Phase, I, and Quadrature, Q, signals) filtering and digitization. In addition, the digitized output can be aligned with a digitized input signal to compensate for transmitter and receiver delay. After delay compensation, DC offsets are removed from the I and Q signals and converted into cartesian representation (amplitude and phase). At this point, magnitude and phase transfer functions between the input signal and the output signal can be calculated, binned and averaged. The results represent the AM-AM and AM-PM distortion of PA 440.

In one embodiment, AM-AM pre-distortion values may be generated by inverting the measured AM-AM function. This measured AM-AM function may be calculated according to Equation 1:

$$\text{Gain}_{mag}=|I_{out}+jQ_{out}|/|I_{in}+jQ_{in}| \qquad [\text{EQ. 1}]$$

In turn, AM-PM pre-distortion values may be generated by changing a sign of the measured AM-PM characteristic. This measured AM-PM gain function, for phase, may be calculated according to Equation 2:

$$\text{Gain}_{phase}=\angle(I_{out}+jQ_{out})-\angle(I_{in}+jQ_{in}) \qquad [\text{EQ. 2}]$$

For purposes of distortion characterization of various packets, the output of PA 440 also may be looped back through portions of the receiver path to distortion characterization circuit 470. As illustrated, incoming baseband complex signals, which may be received at a rate of 160 mega samples per second and digitized in a decimated form, may be received in a DC offset removal circuit 472, which removes any DC offset. Resulting signals are provided to a delay compensation circuit 473 and a delay circuit 474, which compensates for delay between to-be transmitted signals received in distortion characterization circuit 470 and these loopback signals received from the output of PA 440. In turn, signals from these 2 paths are provided to calculators 475*a,b* which may perform Cartesian-to-polar conversions of the signals and provide these values, namely magnitude and phase values to corresponding gain magnitude determination circuit 476*a* and gain phase calculation circuit 476*b*. The determined gain values are provided to corresponding binning and averaging circuits 478*a,b*.

These circuits, based on amplitude of a given sample of the input signal, may bin the resulting gain values into one of a set of bins. In one embodiment the number of bins and the range for each bin may be programmable. Note that these bins may be logarithmically spaced, in an implementation.

As one particular example, a device may be configured to provide between 20 and 80 bins spread out over a range of digital input signal, e.g., approximately 200 mV, in one embodiment. At the conclusion of the analysis, the circuits may determine averages for each bin, along with rms, minimum and maximum values and so forth. Such values may be used to measure the distribution within each bin and optimize the number of bins and the range, to improve LUT build. In turn, these average values for each bin may be provided to corresponding lookup tables 412, 414 to enable configuration of these lookup tables based on the detected distortion in PA 440.

While distortion characterization circuit 470 includes a number of dedicated hardware circuits to perform the various operations to characterize distortion, embodiments are not limited in this regard. Instead of a dedicated application specific integrated circuit hardware approach, in other cases a processor such as a microcontroller, processor core or other programmable hardware circuit may execute instructions stored in a non-transitory storage medium to perform the various operations described above with regard to distortion characterization circuit 470.

Note that distortion characterization circuit 470 may be dynamically controlled to be powered on only when it is performing distortion characterization. As described above, such characterization may occur for a first packet communicated via a given channel. Thereafter, power consumption may be reduced by disabling distortion characterization circuit 470. At this point, a remainder of transceiver 400 may continue to operate and transmit and/or receive wireless information, e.g., in the form of packets. Then, when a given trigger occurs, such as expiration of a trigger interval (which may be on the order of hundreds of milliseconds, in one implementation), and/or a change to one or more of supply voltage, temperature or device aging that exceeds a threshold level, distortion characterization circuit 470 may be powered on to again measure distortion and update or re-configure adaptive distortion circuit 410. In an embodiment, a control circuit may be configured to control this trigger-based enabling and disabling of distortion characterization circuit 470.

Figure 4B:
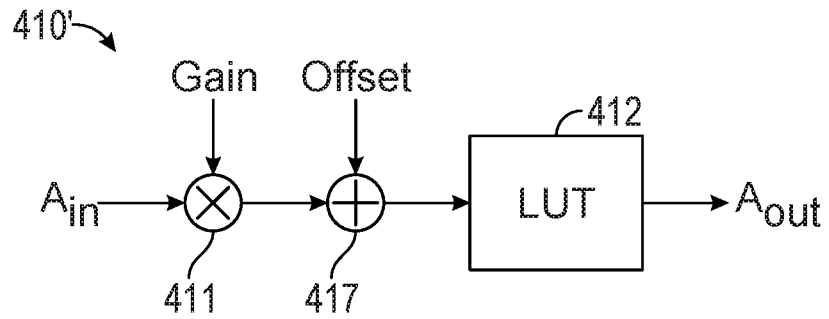
FIG. 4B is a block diagram of a portion of a distortion characterization circuit in accordance with another embodiment.

Understand while shown at this high level in the embodiment of FIG. 4A, many variations and alternatives are possible. For example, as discussed above LUT's may be modified due to non-linearities in the loopback path. To this end, in one embodiment systematic non-linearity in this loopback path may be compensated by way of several adjustments. Referring now to FIG. 4B, shown is a block diagram of a portion of a distortion characterization circuit in accordance with another embodiment. As shown in FIG. 4B, distortion characteristic circuit 410' is at a very high level, only including a single LUT 412. As shown, gain and offset adjustments may occur. More specifically, to compensate for loopback non-linearities, a gain factor may be applied to an incoming signal (Ain) in a multiplier 411. To this end, to provide an increase in the slope of LUT 412, the gain value may be set below 1. In turn, an offset value may be provided by way of an adder 417 to adjust for loopback residual offsets. As seen in FIG. 4B, the input signal Ain as adjusted by one or more of circuits 411, 417 is provided to LUT 412, to result, after pre-distortion, in a pre-distorted output signal Aout.

Figure 4C:
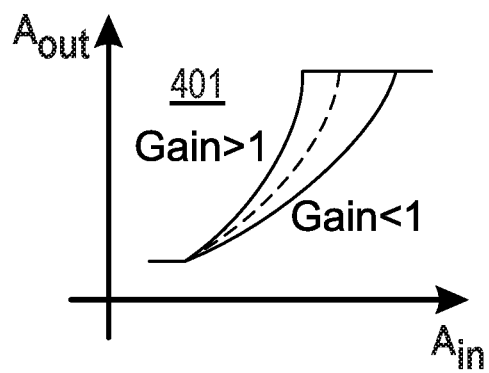
FIGS. 4C-4D are graphical illustrations of non-linearity compensation in accordance with another embodiment.
Figure 4D:
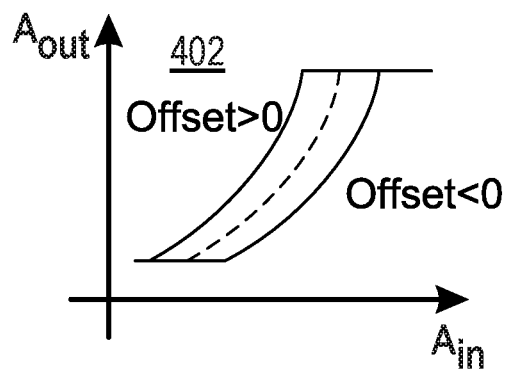

Referring now to FIGS. 4C and 4D, shown are graphical illustrations of this non-linearity compensation. In FIG. 4C, a graph 401 of input signal versus output signal shows how the slope can be modified based on providing this gain value.

Similarly, in FIG. 4C a graph 402 of input signal versus output signal shows how the slope can be modified based on providing this offset value.

Figure 5:
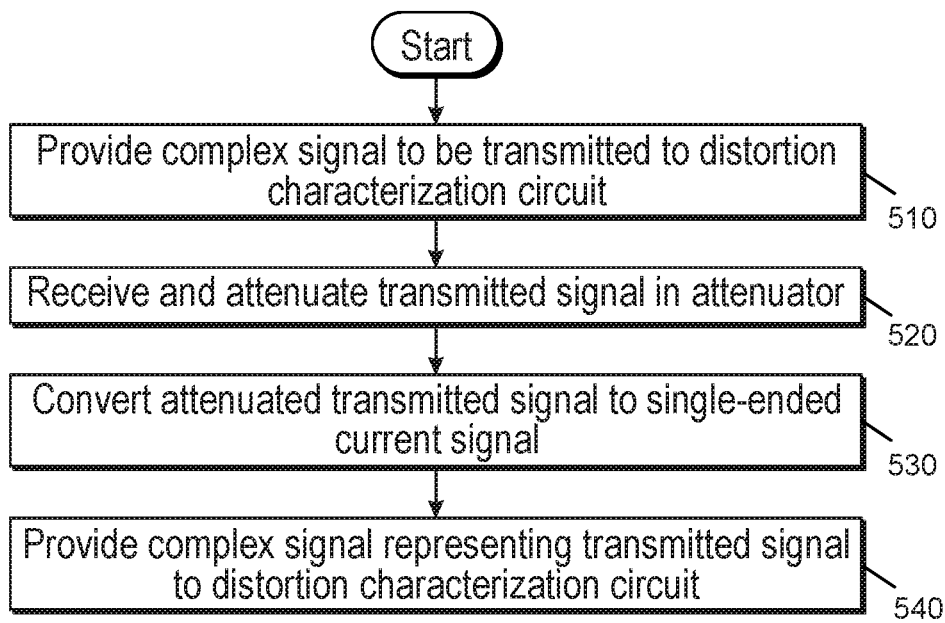
FIG. 5 is a flow diagram of a method in accordance with another embodiment.

Referring now to FIG. 5, shown is a flow diagram of a method in accordance with another embodiment. As shown in FIG. 5, method 500 is a method for obtaining a PA output for purposes of distortion characterization. As such, method 500 may be performed by hardware circuitry, firmware, software and/or combinations thereof within a wireless device to obtain such signal information.

As illustrated, method 500 begins by providing a complex signal to be transmitted to a distortion characterization circuit (block 510). Note that this complex signal may be received from a transmit baseband circuit that provides this complex signal, e.g., as a first packet of a wireless communication. Although described as a complex signal, understand that other signal formats are possible in different implementations.

Still with reference to FIG. 5, next at block 520 a transmitted signal may be received and attenuated in an attenuator. This attenuator may couple to an output of a power amplifier and operate to reduce a level of the transmitted signal to an attenuated signal level. Note that in some embodiments, the level of attenuation may be dynamically controlled according to signal conditions. Next, at block 530 this attenuated transmitted signal may be converted to a single-ended current signal. For example, a transconductance buffer may provide for converting an incoming voltage signal to a current signal and also converting the signal from differential form to single-ended form. Of course other implementations are possible and it is further possible that no conversion occurs and instead a differential signal passes along.

In any event, control next passes to block 540 where the complex signal that represents the transmitted signal is provided to the distortion characterization circuit. Understand that certain processing may be performed on this signal, including downconversion to a baseband or other lower frequency, along with certain filtering, decimation and so forth. Thus with the operation described in FIG. 5, the distortion characterization circuit includes an original signal (namely the signal to be transmitted) and a representation signal that represents the PA output of this signal, such that it may characterize any distortion. Understand while shown at this high level in the embodiment of FIG. 5, many variations and alternatives are possible.

Figure 6:
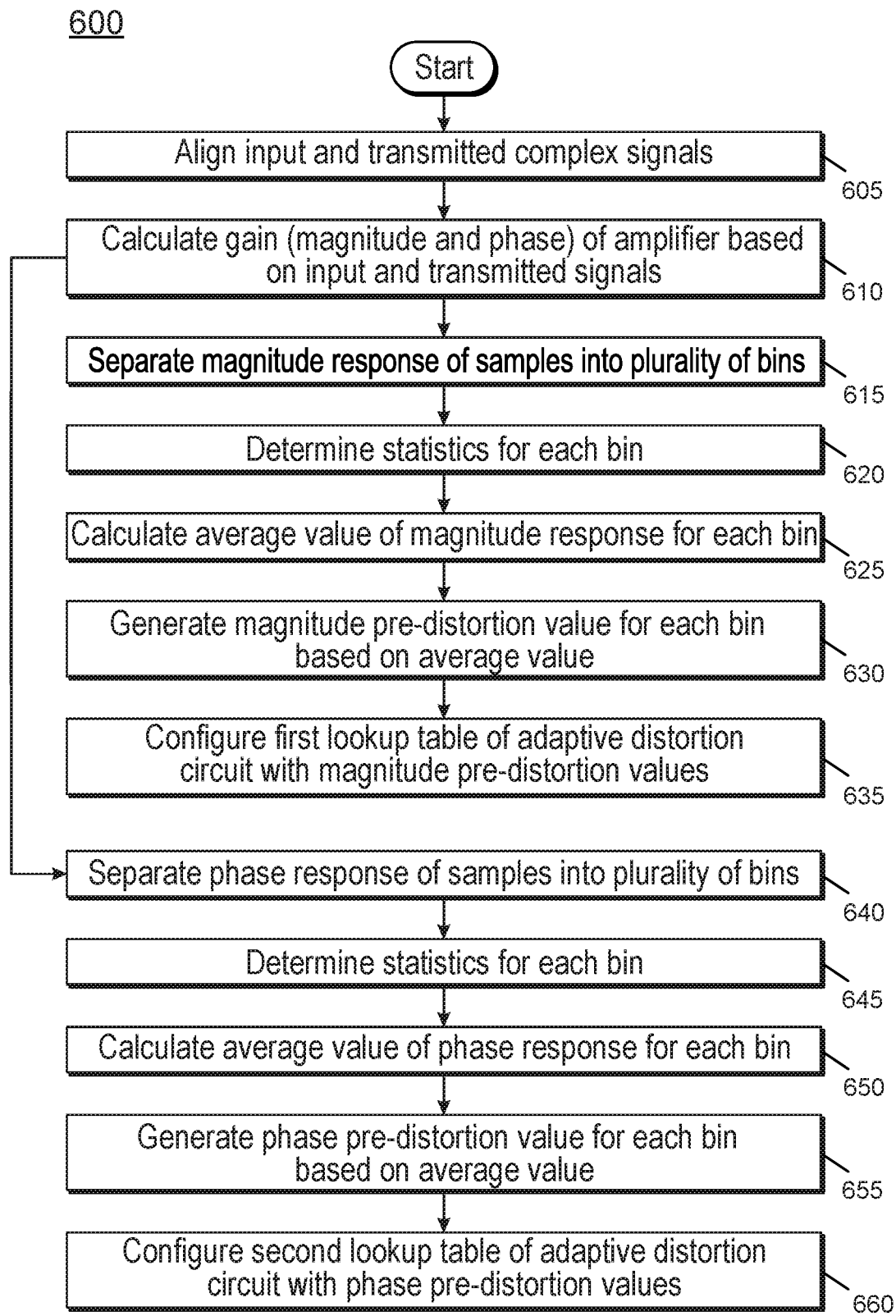
FIG. 6 is a flow diagram of a method in accordance with another embodiment.

Referring now to FIG. 6, shown is a flow diagram of a method in accordance with another embodiment. More specifically, FIG. 6 is a method for characterizing distortion and configuring a distortion circuit based on the determined distortion. In one embodiment, method 600 may be performed by a distortion characterization circuit or other hardware circuit of a transceiver. In other cases, a method 600 may be performed by a combination of hardware circuitry, firmware and/or software.

As illustrated, method 600 begins by aligning an input complex signal with a transmitted complex signal (block 605). For example, some type of correlation may be performed between these 2 different signals to align input and output signals so that accurate analyses can be performed. Control next passes to block 610 where amplifier gain may be calculated. More specifically, measures of amplifier magnitude gain and phase gain may be determined based on the input and transmitted signals. While different implementations are possible, complex signal representations may be processed on a sample-by-sample basis in accordance with Equations 1 and 2 above to determine gain level per sample.

Still with reference to FIG. 6, different data processing paths may be used for processing magnitude and phase information. As shown first beginning at block 615 a gain magnitude analysis may be performed. More specifically at block 615 the magnitude response of multiple samples (e.g., of a given packet communication) may be separated into multiple bins. Although embodiments may vary, in one particular embodiment a programmable number of bins may be present into which these magnitude responses can be separated. For example, as a default setting, there may be 40 different bins, with each bin being associated with a certain amplitude range of the incoming signal. Next after the gain processing is performed, at block 620 various statistics may be determined for each bin, such as a determination of a minimum bin value, maximum bin value and so forth. Furthermore, as shown at block 625 an average value of the magnitude response may be determined for each bin.

Referring still to FIG. 6, from this average value a magnitude pre-distortion value may be generated for each bin (block 630). Although embodiments are not limited in this regard, in one implementation a magnitude pre-distortion value may be generated as a coefficient that has a range between 0 and 2.0. To effect pre-distortion, a selected magnitude pre-distortion value may be applied to an incoming signal, e.g., as a coefficient to provide the desired pre-distortion. Stated another way, magnitude pre-distortion values may be provided so that when applied to incoming signals, a transmitter function is linear (constant magnitude) across the bins.

Referring still to FIG. 6, next at block 635 a first lookup table of an adaptive distortion circuit may be configured. More specifically, the magnitude pre-distortion values may be provided to the adaptive distortion circuit to configure it to perform magnitude pre-distortion. In an embodiment, this first lookup table may include a number of entries, e.g., corresponding to the number of bins, where each entry includes a magnitude pre-distortion value.

Note that similar operations may be performed at blocks 640, 645, 650, 655 and 660 to process the phase response and generate phase pre-distortion values and configure a second lookup table of the adaptive distortion circuit with the phase pre-distortion values. Understand while shown at this high level in the embodiment of FIG. 6, many variations and alternatives are possible.

Figure 7:
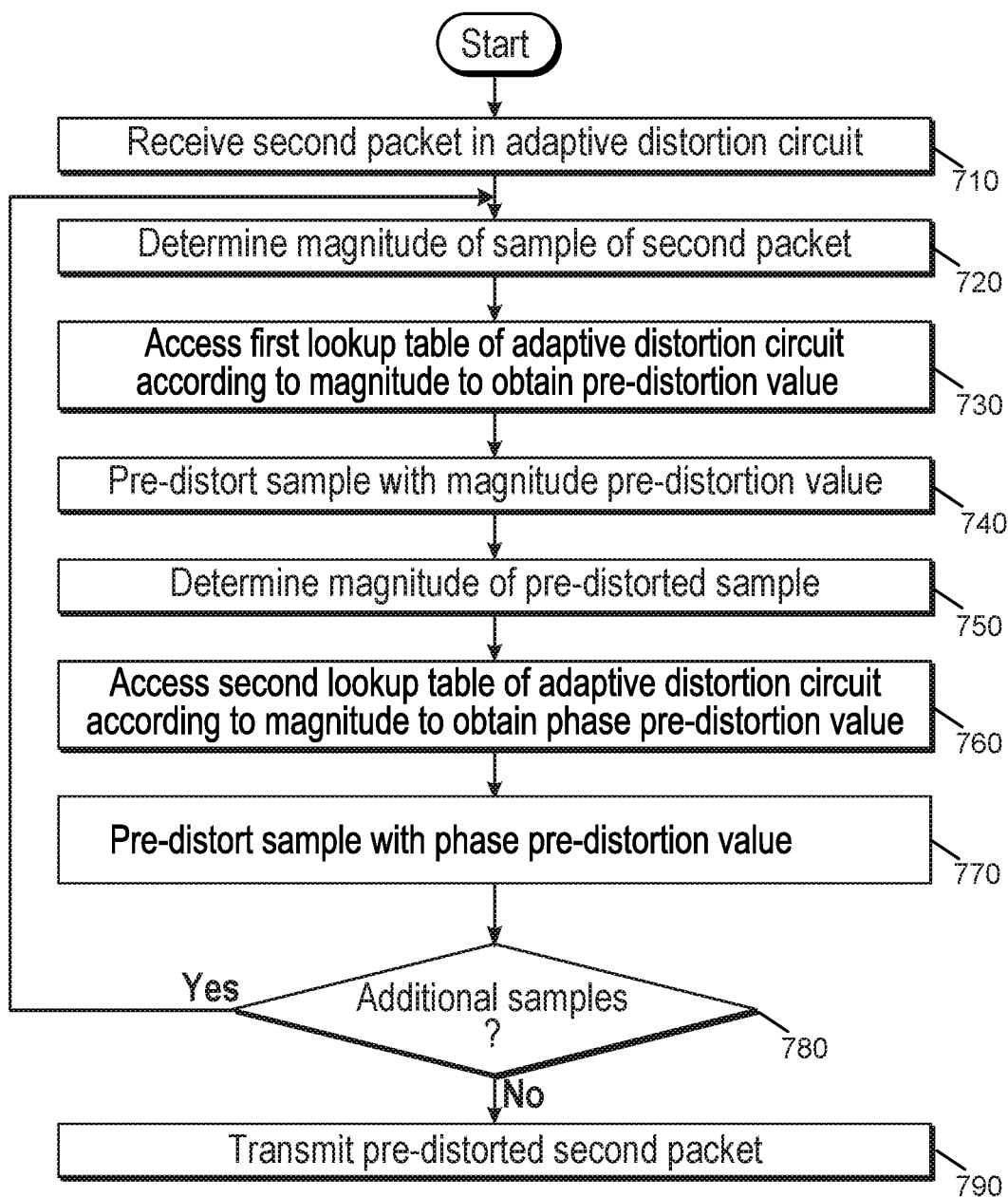
FIG. 7 is a flow diagram of a method in accordance with yet another embodiment.

Referring now to FIG. 7, shown is a flow diagram of a method in accordance with yet another embodiment. As shown in FIG. 7, method 700 is a method for performing adaptive pre-distortion of a packet. Accordingly, method 700 may be performed by an adaptive distortion circuit as described herein which, in some implementations, may execute firmware and/or software to perform the pre-distortion.

As illustrated, method 700 begins by receiving a second packet in the adaptive distortion circuit (block 710). Note that the second packet is a packet that follows, e.g., a first packet such as an original packet transmitted and for which distortion was measured, such as described above in FIG. 2. Of course in other cases the second packet may be any packet to be sent from a transmitter after the adaptive distortion circuit has been configured. Note that this second packet can have characteristics (e.g., in terms of bandwidth, peak-to-average power ratio) completely different from the first packet.

As shown, control passes to block 720 where a magnitude of a sample of the second packet may be determined. In an embodiment, this magnitude may be determined based on a sum of squares of a complex value of the sample. Next at block 730 a first lookup table of the adaptive distortion circuit may be accessed based on determined magnitude. More specifically, a given entry can be accessed based on the magnitude to obtain a magnitude pre-distortion value corresponding to this sample magnitude. Then at block 740 the sample may be pre-distorted with this magnitude pre-distortion value. As described, in one embodiment the magnitude pre-distortion value may be used as a coefficient, such that the original sample is multiplied with the coefficient to insert a first amount of pre-distortion. Then at block 750, a magnitude of this pre-distorted sample may be determined. As described above, this magnitude determination may be based on a sum of squares of the complex values.

Still with reference to FIG. 7, next at block 760, a second lookup table of the adaptive distortion circuit may be accessed based on determined magnitude of the pre-distorted sample. More specifically, a given entry can be accessed based on this magnitude to obtain a phase pre-distortion value corresponding to this pre-distorted sample magnitude. Then at block 770 the pre-distorted sample additionally may be pre-distorted with this phase pre-distortion value, to obtain the pre-distorted sample, now pre-distorted both for magnitude and phase distortion.

Next it may be determined at diamond 780 whether there are additional samples of the second packet. If so, control passes back to block 720 to begin the process of pre-distorting another sample. Otherwise when it is determined that there are no more samples, the pre-distorted second packet may be transmitted (block 790). Understand that additional signal processing may be performed on samples of the pre-distorted second packet before it is transmitted via a power amplifier. By way of this pre-distortion, the resulting output of the power amplifier is an amplified RF signal with greater fidelity, namely lower distortion. Although shown at this high level in the embodiment of FIG. 7, many variations and alternatives are possible.

Figure 8:
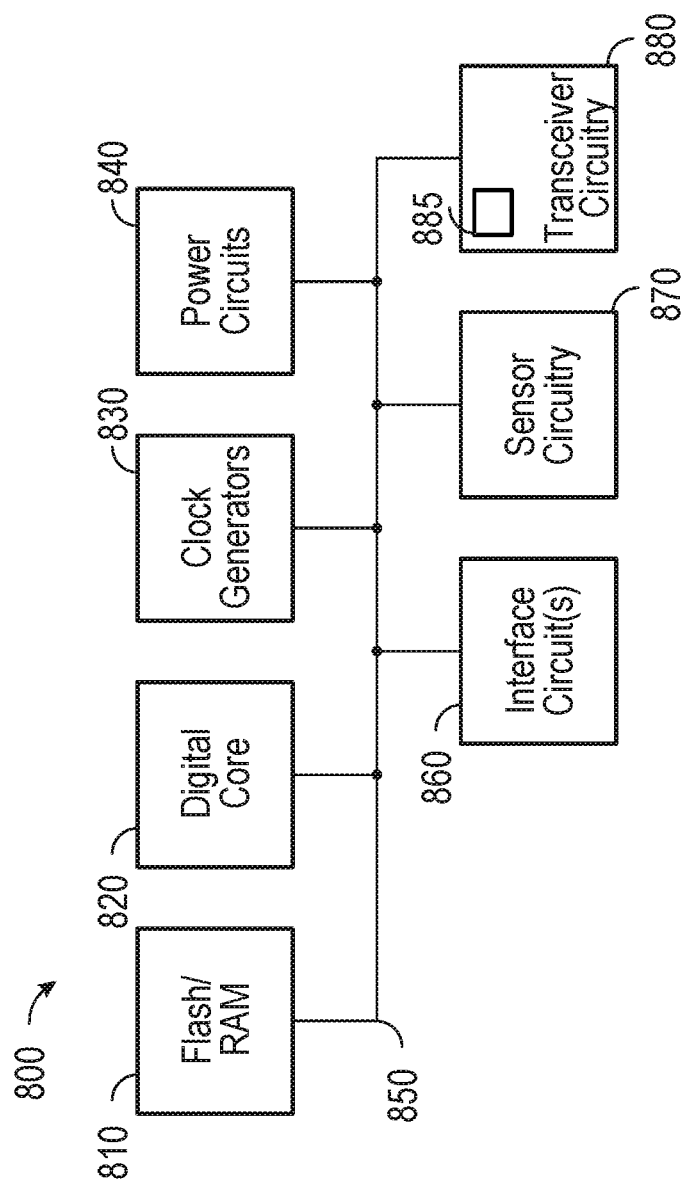
FIG. 8 is a block diagram of a representative integrated circuit in accordance with an embodiment.

Referring now to FIG. 8, shown is a block diagram of a representative integrated circuit 800 which may include an adaptive distortion circuit and a distortion characterization circuit as described herein. In the embodiment shown in FIG. 8, integrated circuit 800 may be, e.g., a microcontroller, wireless transceiver or other device that can be used in a variety of use cases, including sensing, metering, monitoring, embedded applications, communications, applications and so forth.

In the embodiment shown, integrated circuit 800 includes a memory system 810 which in an embodiment may include a non-volatile memory such as a flash memory and volatile storage, such as RAM. In an embodiment, this non-volatile memory may be implemented as a non-transitory storage medium that can store instructions and data. Such non-volatile memory may store instructions for controlling the distortion characterization and pre-distortion operations described herein.

Memory system 810 couples via a bus 850 to a digital core 820, which may include one or more cores and/or microcontrollers that act as a main processing unit of the integrated circuit. In turn, digital core 820 may couple to clock generators 830 which may provide one or more phase locked loops or other clock generation circuitry to generate various clocks for use by circuitry of the IC.

As further illustrated, IC 800 further includes power circuitry 840, which may include one or more voltage regulators. Additional circuitry may optionally be present depending on particular implementation to provide various functionality and interaction with external devices. Such circuitry may include interface circuitry 860 which may provide interface with various off-chip devices, sensor circuitry 870 which may include various on-chip sensors including digital and analog sensors to sense desired signals, such as for a metering application or so forth.

In addition as shown in FIG. 8, transceiver circuitry 880 may be provided to enable transmission and receipt of wireless signals, e.g., according to one or more of a local area or wide area wireless communication scheme, such as IEEE 802.11, IEEE 802.15.4, Zigbee, Bluetooth, cellular communication or so forth. To this end, transceiver circuitry 880 may include circuitry 885 for performing distortion characterization and pre-distortion of to-be transmitted signals and dynamically updating the pre-distortion as described herein. Understand while shown with this high level view, many variations and alternatives are possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a modulator to modulate a first signal;
   a distortion circuit coupled to the modulator to digitally pre-distort the first signal to compensate for a distortion of an amplifier;
   a distortion characterization circuit coupled to the distortion circuit, wherein the distortion characterization circuit is to determine the distortion of the amplifier and configure the distortion circuit based on the determined distortion, the distortion characterization circuit to provide a plurality of pre-distortion values to the distortion circuit, each of the plurality of pre-distortion values associated with an amplitude bin and comprising an average value of a response of a plurality of samples of the first signal, wherein the distortion circuit is to select at least one of the plurality of pre-distortion values based on an amplitude of the first signal and digitally pre-distort the first signal using the at least one of the plurality of pre-distortion values;
   a mixer coupled to the distortion circuit to upconvert the pre-distorted first signal to a pre-distorted radio frequency (RF) signal;
   the amplifier coupled to the mixer to amplify the pre-distorted RF signal and output an amplified RF signal; and
   a loopback circuit coupled between the amplifier and the distortion characterization circuit to provide the amplified RF signal output by the amplifier to the distortion characterization circuit, the loopback circuit comprising:
      an attenuator comprising a first plurality of capacitors and a second plurality of capacitors, the second plurality of capacitors programmable; and
      a transconductance amplifier coupled to the attenuator, wherein the transconductance amplifier is programmable.

2. The apparatus of claim 1, wherein the distortion characterization circuit comprises a closed loop feedback circuit coupled to the amplifier.

3. The apparatus of claim 1, wherein the distortion circuit comprises at least one table including a plurality of entries, each entry to store one of the plurality of pre-distortion values.

4. The apparatus of claim 1, wherein the distortion circuit comprises:

a first lookup table to digitally pre-distort the first signal according to an amplitude transfer function of the amplifier; and a second lookup table to digitally pre-distort the first signal according to a phase transfer function of the amplifier.

5. The apparatus of claim 1, wherein the distortion characterization circuit is to determine the distortion of the amplifier for a first packet and the distortion circuit is digitally pre-distort a next packet based on the determined distortion of the amplifier for the first packet.

6. The apparatus of claim 1, wherein the distortion characterization circuit is to:

receive a first plurality of samples of a first packet before the first packet is provided to the amplifier and receive a second plurality of samples of the first packet after amplification in the amplifier; and determine, for a plurality of bins, a gain of the amplifier based on the first plurality of samples and the second plurality of samples, the gain comprising a magnitude and a phase, and generate a set of pre-distortion values for the plurality of bins based on the gain of the amplifier.

7. The apparatus of claim 1, wherein the distortion characterization circuit is to re-configure the distortion circuit in response to one or more of temperature variation and voltage variation that exceeds a threshold.

8. The apparatus of claim 1, wherein the amplifier comprises a main path and an auxiliary path.

9. The apparatus of claim 3, wherein the distortion circuit is to adjust a level of the first signal and provide the adjusted first signal to the lookup table, to cause the lookup table to select one of the plurality of entries, the adjusted first level to compensate for non-linearity in the loopback circuit.

10. The apparatus of claim 7, wherein the distortion characterization circuit is to be disabled until the one or more of the temperature variation and the voltage variation exceeds the threshold.

11. A method comprising:

receiving, in a distortion characterization circuit of a transceiver, a first packet output from an amplifier of the transceiver, via a loopback circuit comprising:

an attenuator having a first plurality of capacitors and a second plurality of programmable capacitors; and a programmable transconductance amplifier coupled to the attenuator;

determining, in the distortion characterization circuit, a gain distortion of the amplifier based on the first packet, the gain distortion comprising a magnitude and a phase;

configuring an adaptive distortion circuit of the transceiver based on the gain distortion, comprising processing the first packet from a transmitter path of the transceiver and processing the first packet output from the amplifier to determine the gain distortion including a first pre-distortion value comprising an average value of the plurality of samples for the magnitude of the gain distortion and a second pre-distortion value comprising an average value of the plurality of samples for the phase of the gain distortion;

pre-distorting, in the adaptive distortion circuit, a second packet; and transmitting the pre-distorted second packet via the amplifier of the transceiver.

12. The method of claim 11, further comprising:

providing, for each of a plurality of bins, the first pre-distortion value and the second pre-distortion value to the adaptive distortion circuit; and pre-distorting the second packet using one or more of the first pre-distortion value and the second pre-distortion value for one or more of the plurality of bins.

13. The method of claim 11, further comprising enabling the distortion characterization circuit and dynamically re-configuring the adaptive distortion circuit in response to expiration of a trigger interval.

14. An apparatus comprising:

a transmitter to transmit a radio frequency (RF) signal, the transmitter comprising:

a modulator to modulate a first baseband signal;

an adaptive distortion circuit coupled to the modulator to digitally pre-distort the modulated first baseband signal, wherein the adaptive distortion circuit is to be dynamically updated based on a measured distortion of an amplifier;

a mixer coupled to the adaptive distortion circuit to upconvert the pre-distorted modulated first baseband signal to the RF signal; and the amplifier coupled to the mixer to amplify and output the RF signal;

a loopback circuit coupled to the amplifier to provide the RF signal to a receiver, the loopback circuit comprising:

an attenuator having a first plurality of capacitors and a second plurality of programmable capacitors; and a programmable transconductance amplifier coupled to the attenuator; and the receiver coupled to the loopback circuit, the receiver comprising:

a second mixer to receive and downconvert the RF signal to a second baseband signal; and a distortion characterization circuit coupled to the second mixer, the distortion characterization circuit to receive a plurality of samples of the first baseband signal and a plurality of samples of the second baseband signal and based thereon to measure the distortion of the amplifier, wherein the distortion characterization circuit is to dynamically update the adaptive distortion circuit based on the measured distortion, comprising to provide a plurality of pre-distortion values.

15. The apparatus of claim 14, wherein the mixer is to output a main path RF signal and an auxiliary path RF signal, and the amplifier is to amplify and output the RF signal comprising the main path RF signal and the auxiliary path RF signal.

* * * * *